United States Patent
Chow et al.

(10) Patent No.: US 7,940,154 B2
(45) Date of Patent: May 10, 2011

(54) CHOKE MODULE HAVING IMPROVED TERMINAL ARRANGEMENT

(75) Inventors: John Chow, Saratoga, CA (US);
Chih-Min Lin, Tu-Cheng (TW);
Yong-Chun Xu, Kunshan (CN);
Jian-Ming Bu, Kunshan (CN)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/624,449

(22) Filed: Nov. 24, 2009

(65) Prior Publication Data
US 2010/0134228 A1    Jun. 3, 2010

(30) Foreign Application Priority Data
Nov. 28, 2008   (CN) .................. 2008 2 0302981 U

(51) Int. Cl.
*H01F 27/29* (2006.01)
(52) U.S. Cl. ........................................ 336/192
(58) Field of Classification Search ............... 336/65, 336/107, 192, 90–92, 200
See application file for complete search history.

(56) References Cited

U.S. PATENT DOCUMENTS

| | | | | |
|---|---|---|---|---|
| 3,721,747 | A | * | 3/1973 | Renskers ................. 174/532 |
| 7,843,300 | B2 | * | 11/2010 | Wang et al. ............... 336/192 |
| 2007/0194875 | A1 | | 8/2007 | Wang et al. |
| 2009/0160580 | A1 | * | 6/2009 | Hsieh et al. .............. 333/185 |
| 2010/0142173 | A1 | * | 6/2010 | Chen ........................ 361/811 |

* cited by examiner

*Primary Examiner* — Tuyen Nguyen
(74) *Attorney, Agent, or Firm* — Ming Chieh Chang; Wei Te Chung; Ming Chieh Chang

(57) ABSTRACT

A choke module (100) for an insulative housing (2) includes a first and a second walls (23, 24) defining a first and a second receiving cavities (28, 29); a first set of contact terminals (4) arranged in the first wall, a second set of contact terminals (4) arranged in the second wall, a third set of contact terminals (5) disposed in the partition, a paddle board (6) having a number of conductive traces and attached to the insulative housing to interconnect the first and third set of contact terminals, a number of chokes (8) wound with wires which interconnects the first and second sets of contact terminals. The first and second contact terminal has a first and a second soldering portion (42) extending out of the housing and a first and a second mating portion (41) at the first wall.

18 Claims, 4 Drawing Sheets

CHOKE MODULE HAVING IMPROVED TERMINAL ARRANGEMENT

BACKGROUND OF THE INVENTION

1. Field of the Invention

The present invention relates to a choke module, and more particularly to a choke module having improved terminal arrangement for application in high speed signal transmission systems.

2. Description of Related Art

U.S. Patent Application Publication No. 2007/0194875 published on Aug. 23, 2007 discloses a choke module comprising an insulative housing having a first surface, an opposed second surface, a receiving cavity, a plurality of magnetic components retained in the receiving cavity, a plurality of first terminals fixed at the first surface and soldered onto a first printed circuit board, a plurality of second terminals fixed at the second surface and soldered onto a second printed circuit board, and a plurality of conducting pins penetrating through and protruding from both the first and second surfaces. The magnetic component has a magnetic core and a plurality of wires wound around the magnetic core. The wire has a first end connected to the first terminal and a second end connected to the second terminal. The first printed circuit board has SMD (Surface Mount Device) elements soldered thereon. The conducting pins are connected with the first and second printed circuit boards.

The first and second printed circuit boards are mounted at opposite first and second surfaces of the insulative housing. The first and second terminals are fixed at opposite first and second surfaces of the insulative housing. The first and second surfaces need to be formed into a certain thickness to secure the first and second terminals. The choke module has to be formed into a certain height. Therefore, it is hard to comply with the miniature trend of the product as customers require.

Hence, an improved electrical module is highly desired.

SUMMARY OF THE INVENTION

Accordingly, an object of the present invention is to provide a choke module having improved terminal arrangement to minimize the height of the choke module.

In order to achieve the object set forth, a choke module in accordance with the present invention for soldering on a circuit board includes an insulative housing having a first and a second walls defining a first and a second receiving cavities; a first set of contact terminals arranged in the first wall, a second set of contact terminals arranged in the second wall, a third set of contact terminals disposed in the partition, a paddle board having a number of conductive traces and attached to the insulative housing to interconnect the first and third set of contact terminals, a number of chokes wound with wires which interconnects the first and second sets of contact terminals. The first and second contact terminal has a first and a second soldering portion extending out of the housing and a first and a second mating portion at the first wall. The insulative housing has a base wall. The first and the second walls respectively have an exposed face opposite to the base wall. The first and the second mating portions and the first and second soldering portions of the first and second set of contact terminals are disposed at a same side of the exposed face.

The first and second mating portions and the first and second soldering portions of the first and second set of contact terminals are disposed at a same side of the exposed face. Therefore the printed circuit board and the paddle board can be disposed at a same side of the insulative housing. It is unnecessary to provide two walls having certain thickness for fixing the opposite terminals, at opposite sides of the insulative housing. Therefore, it is possible to form a choke module having smaller height.

Other objects, advantages and novel features of the invention will become more apparent from the following detailed description when taken in conjunction with the accompanying drawings.

DETAILED DESCRIPTION OF THE PREFERRED EMBODIMENT

Figure 1:
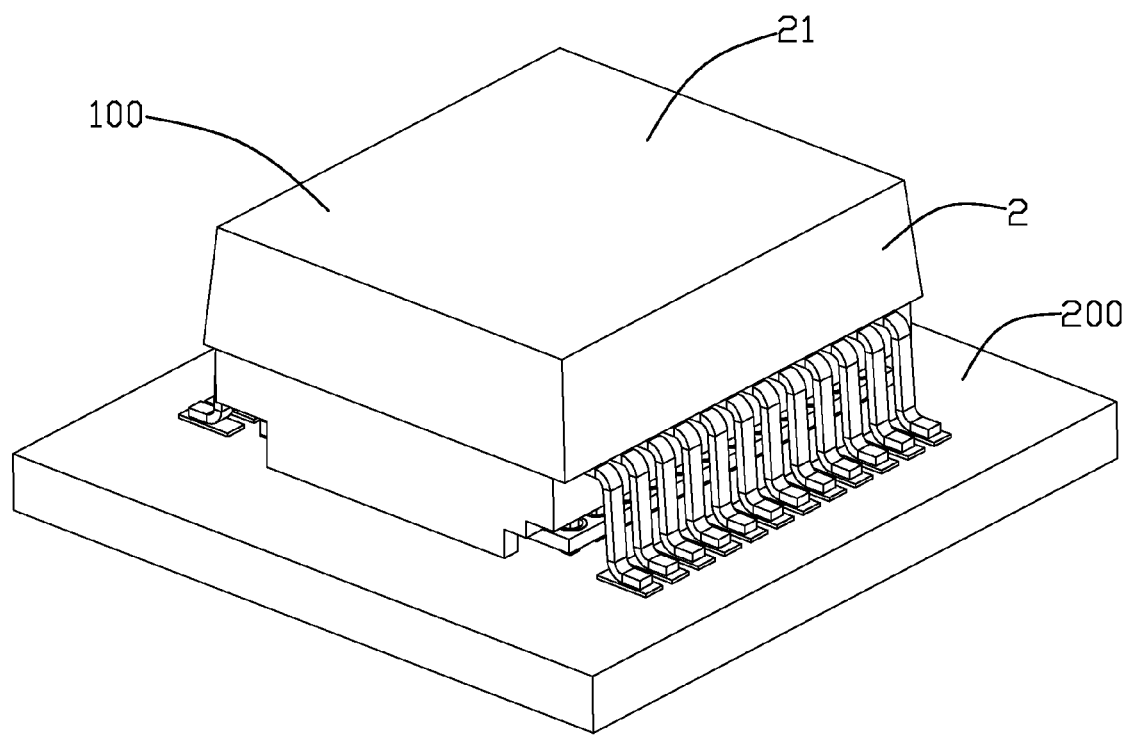
FIG. 1 is an assembled perspective view showing a choke module in accordance with the present invention mounted on a mother board.

Reference will now be made in detail to the preferred embodiment of the present invention. Referring to FIGS. 1-4, a choke module 100 mounted on a mother board 200 comprises an insulative housing 2, a plurality of connecting terminals 4 and converting terminals 5 fixed in the insulative housing 2, a magnetic module 8 received in the insulative housing 2 and a paddle board 6 attached to the insulative housing 2.

Figure 2:
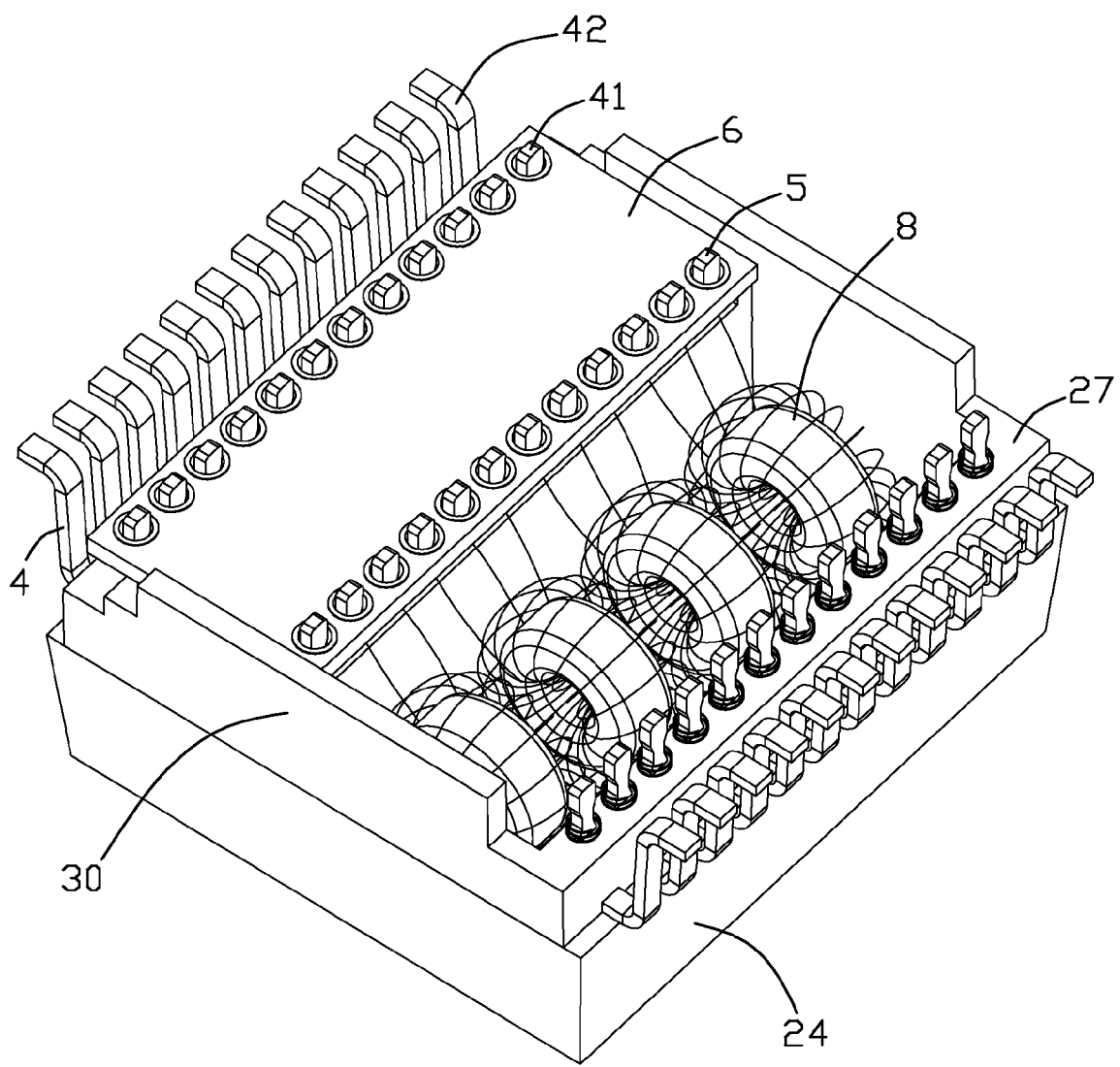
FIG. 2 is an assembled perspective view showing the choke module.
Figure 3:
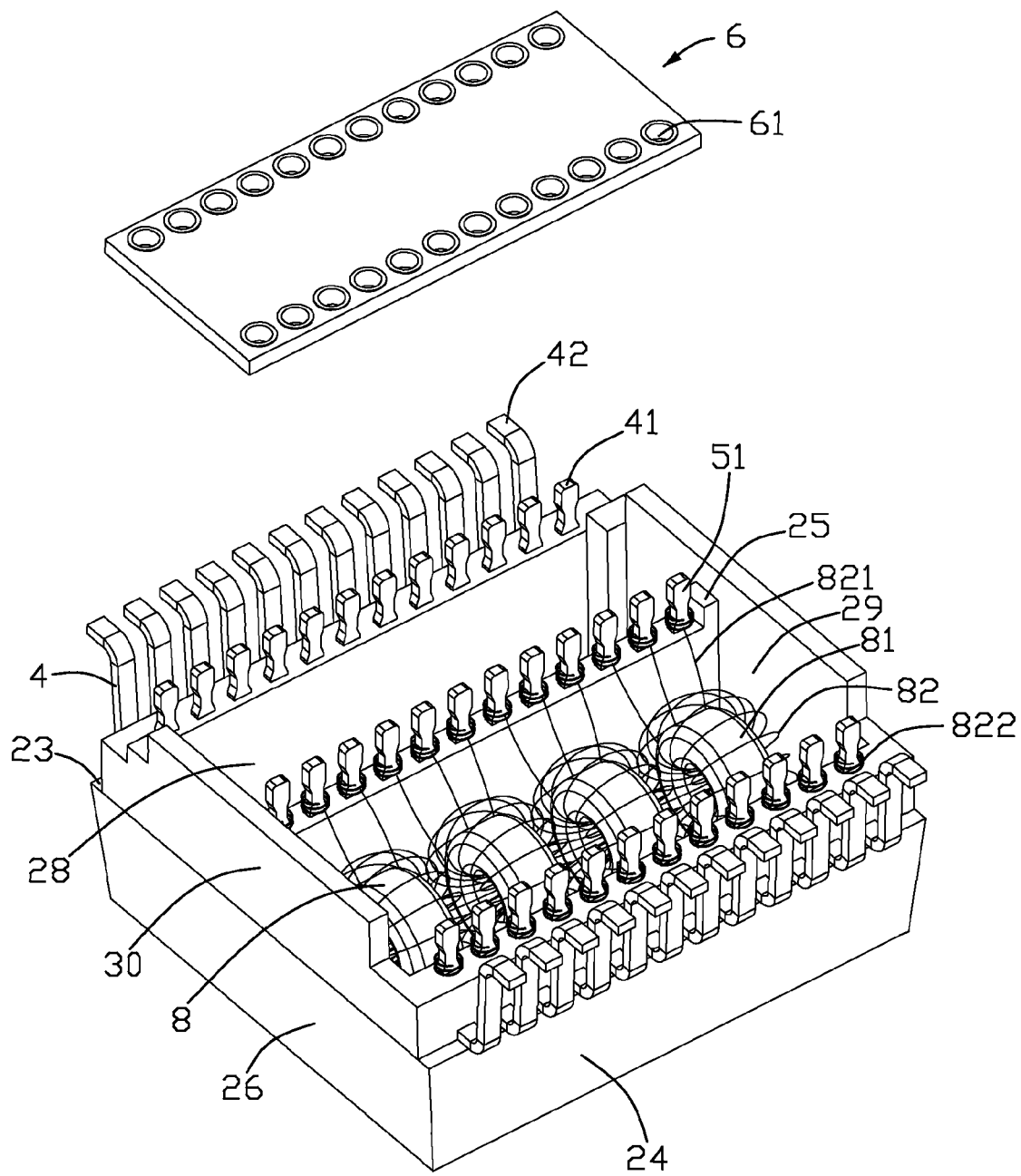
FIG. 3 is a partially exploded perspective view showing the choke module.

Referring to FIGS. 1-3, the insulative housing 2 comprises a base wall 21, a peripheral wall 23, an opposite side wall 24, a pair of connecting walls 26 extending downwardly from the base wall 21, and a receiving cavity defined therebetween. The insulative housing 2 further comprises a partition 25 in parallel to the peripheral wall 23 to divide the receiving cavity into a first compartment of receiving cavity 28 between the peripheral wall 23 and the partition 25, and a second compartment of receiving cavity 29 between the side wall 24 and the partition 25. The peripheral wall 23, the side wall 24 and the partition 25 respectively have a bottom face 27. The bottom faces 27 of the peripheral wall 23, the side wall 24 and the bottom face 27 are generally coplanar. Each connecting wall 26 is formed with a supporting portion 30 extending downwardly therefrom for supporting the insulative housing 2 on the mother board 200.

Referring to FIGS. 2-3, the connecting terminals 4 include a first group of connecting terminals 4 fixed in the peripheral wall 23 and a second group of connecting terminals 4 fixed in the side wall 24. Each connecting terminal 4 comprises a body portion (not shown) embedded in the peripheral wall 23 or the side wall 24, and a conductive portion 41 projecting downwardly from the bottom face 27. The body portion of the connecting terminal 4 extends outwardly from a middle portion of the peripheral wall 23 or side wall 24 and is bent downwardly to form a tail portion 42. The tail portions 42 are substantially flushed with a lower surface of the supporting portion 30 and are adapted for being mounted onto the mother board 200 by SMT (Surface Mount Technology). The conductive portion 41 and the tail portion 42 are disposed at a same side below the bottom face 27 of the peripheral wall 23 or the side wall 24.

Referring to FIGS. 2 and 3, each converting terminal 5 comprises a body portion (not shown) embedded in the partition 25 of the insulative housing 2 and a contact portion 51 projecting downwardly from the bottom face 27 of the partition 25.

Referring to FIGS. 2 and 3, the magnetic module 8 comprises a plurality of magnetic cores 81 and a plurality of conductive wires 82 wound around the magnetic cores 81. The magnetic cores 81 are retained in the second compartment of receiving cavity 29 of the insulative housing 2. The wire 82 has a first end 821 connected to the contact portion 51 of the converting terminal 5, and a second end 822 connected to the conductive portion 41 of one of the second group of connecting terminals 4.

Figure 4:
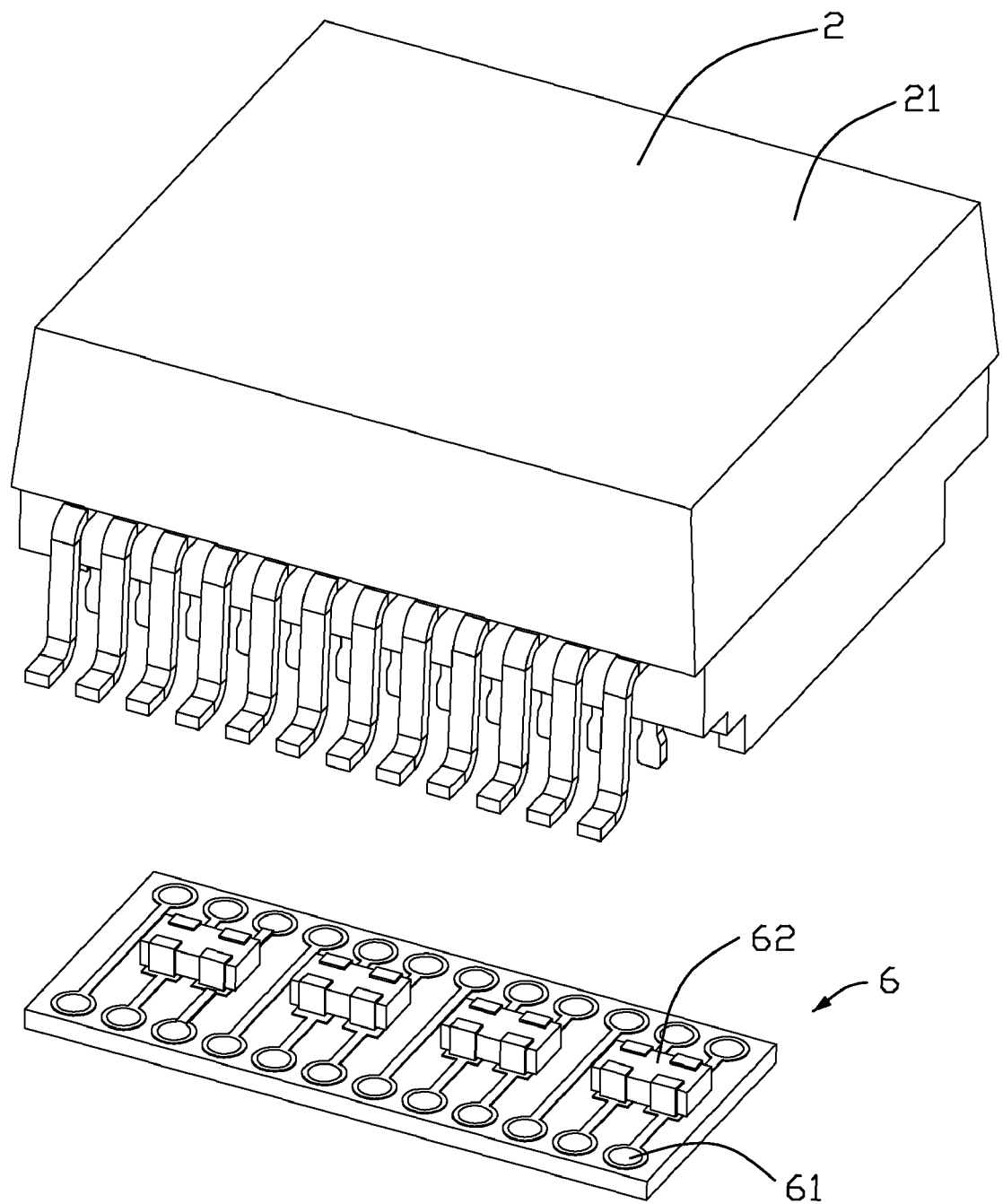
FIG. 4 is a view similar to FIG. 3, taken from another aspect.

Referring to FIGS. 3 and 4, the paddle board 6 has a plurality of electronic components 62 mounted on an upper surface thereof and two array of mounting holes 61 defined along opposite side edges of the paddle board 6. The paddle board 6 is attached to the insulative housing 2 to cover the first compartment of receiving cavity 28, with the electronic components 62 retained in the first compartment of receiving cavity 28. The paddle board 6 is supported by the peripheral wall 23 and the partition 25. The conductive portions 41 of the first group of connecting terminals 4 and the contact portions 51 of the converting terminals 5 are soldered into the mounting holes 61 of the paddle board 6.

In the preferred embodiment shown, the magnetic module 8 functions as a transformer and the electronic component 62 of the paddle board 6 functions as a CMC (Common Mode Choke). The transformer is electrically connected with CMC via the converting terminals 5. Optionally, the magnetic module 8 is performed as a CMC and the electronic component 62 is performed as surface mounted transformer. The CMC is electrically connected with the transformer via the converting terminals 5.

The conductive portions 41 connected with the paddle board 6 and the tail portions 42 soldered onto the mother board 200 are disposed at a same side of the bottom faces 27 of the insulative housing 2. The mother board 200 and the paddle board 6 are disposed at a same side of the insulative housing 2. Neither connecting terminals 4 nor converting terminals 5 are mounted on the base wall 21. It is unnecessary to form the base wall 21 into a certain thickness to embed terminals. Therefore, it is possible to form the choke module 100 at a low profile.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A choke module assembly comprising:
    an insulative housing having a base wall, a plurality of standing walls extending perpendicularly from the base wall;
    a first group and a second group of connecting terminals fixed in two of the standing walls respectively;
    a plurality of converting terminals fixed in another standing wall;
    a magnetic module connected with the second group of connecting terminals and the converting terminals;
    a printed circuit board connected with the first group and the second group of connecting terminals; and
    a paddle board connected with the first group of connecting terminals and the converting terminals.

2. The choke module assembly as claimed in claim 1, wherein said standing walls comprise a first wall, a second wall, and a partition disposed between the first and second walls.

3. The choke module assembly as claimed in claim 2, wherein said insulative housing has a first receiving cavity defined between the first wall and the partition for engaging with the paddle board, and a second receiving cavity defined between the second wall and the partition for receiving the magnetic module.

4. The choke module assembly as claimed in claim 3, wherein each converting terminal has a contact portion, and each connecting terminal has a conductive portion and a tail portion.

5. The choke module assembly as claimed in claim 4, wherein said magnetic module comprises a plurality of magnetic cores and a plurality of wires winding around the magnetic cores, each wire having a first end connected to the contact portion of the converting terminal and a second end connected to the conductive portion of one of the second group of connecting terminals.

6. The choke module assembly as claimed in claim 4, wherein said tail portions of the first and second groups of connecting terminals are soldered onto the printed circuit board, said printed circuit board and the paddle board disposed opposite to the base wall of the insulative housing.

7. A choke module for mounting on a printed circuit board, comprising:
    an insulative housing comprising a first and a second walls defining a central cavity therebetween, and with a partition arranged therein to divide the cavity into first and second compartments;
    a first set of contact terminals arranged in the first wall and having a first soldering portion extending out of the housing, and a first mating portion at the first wall;
    a second set of contact terminals arranged in the second wall and having a second soldering portion extending out of the housing, and a second mating portion at the second wall;
    a third set of contact terminals disposed in the partition;
    a first paddle board having a plurality of conductive traces and attached to the housing to interconnect the first and third set of contact terminals; and
    a plurality of chokes wound with wires which interconnect the second and third sets of contact terminals.

8. The choke module as claimed in claim 7, wherein said insulative housing has a base wall, and wherein said first and the second walls respectively have an exposed face opposite to the base wall, said first and the second mating portions and the first and second soldering portions of the first and second set of contact terminals being disposed at a same side of the exposed face.

9. The choke module as claimed in claim 8, wherein said third set of contact terminal has a third mating portion, said partition has a bottom face, said bottom face and said exposed faces being coplanar, and wherein the first and second mating portions and the first and second soldering portions are disposed below the exposed faces, and the third mating portions are disposed below the bottom face.

10. The choke module as claimed in claim 7, wherein said first compartment of the central cavity is defined between the first wall and the partition, and the second compartment of the central cavity is defined between the partition and the second wall.

11. The choke module as claimed in claim 10, wherein said magnetic module comprises a plurality of magnetic cores received in the second compartment of the receiving cavity and a plurality of wires winding around the magnetic core, said wire having a first end connected to the third mating portion of the third contact terminal and a second end connected to the second mating portion of the second contact terminal.

12. The choke module as claimed in claim 10, wherein said paddle board has two rows of mounting holes defined thereon, said third terminals and the first mating portions of the contact terminals engaging with the two rows of mounting holes, respectively.

13. The choke module as claimed in claim 10, wherein said paddle board covers on the first compartment of receiving cavity and is provided with a plurality of electronic components received in the first receiving cavity.

14. The choke module as claimed in claim 13, wherein said magnetic module is a common mode choke and the electronic component is a transformer.

15. The choke module as claimed in claim 13, wherein said magnetic module is a transformer and the electronic component is a common mode choke.

16. A choke module assembly comprising:
   an insulative housing defining first, second and third upstanding walls spaced from one another in a parallel relation under condition that the third wall is located between the first wall and the second wall;
   first, second and third sets of contacts disposed in the corresponding first, second ad third upstanding wall, respectively;
   said first set of contacts and said second set of contacts having mounting sections to connect to an exterior board;
   a plurality of chokes located between the first upstanding wall and said third upstanding wall, and respectively mechanically and electrically connected between said first set of contacts and said third set of contacts; and
   an interior board having a plurality of electronic components thereon and equipped with traces to respectively mechanically and electrically connected between the second set of contacts and the third set of contacts; wherein
   said chokes perform one of a transformer function and a CMC (Common Mode Choke) function while said electronic components perform the other.

17. The choke module assembly as claimed in claim 16, wherein said interior board is parallel to said exterior board.

18. The choke module assembly as claimed in claim 16, wherein said chokes are located between the first upstanding wall and the third upstanding wall while the interior board is seated upon the second upstanding wall and said third upstanding wall.

* * * * *